United States Patent
Boehm et al.

(10) Patent No.: US 6,501,686 B2
(45) Date of Patent: Dec. 31, 2002

(54) ELECTRONIC DRIVER CIRCUIT FOR WORD LINES IN A MEMORY MATRIX, AND MEMORY APPARATUS

(75) Inventors: Thomas Boehm, Zorneding (DE); Thomas Roehr, Aschheim (DE); Dietmar Gogl, Fishkill, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/927,556

(22) Filed: Aug. 9, 2001

(65) Prior Publication Data

US 2002/0050448 A1 May 2, 2002

(30) Foreign Application Priority Data

Aug. 9, 2000 (DE) .......................... 100 38 925

(51) Int. Cl.$^7$ ................................. G11C 7/00
(52) U.S. Cl. ............. 365/189.11; 365/158; 365/230.06
(58) Field of Search ................ 365/230.06, 189.11, 365/185.23, 158

(56) References Cited

U.S. PATENT DOCUMENTS

| | | | |
|---|---|---|---|
| 4,651,031 A | 3/1987 | Kamuro ................. | 365/230.06 |
| 5,365,479 A | 11/1994 | Hoang et al. .......... | 365/189.09 |
| 5,793,695 A * | 8/1998 | Kohno ................... | 365/230.06 |
| 5,808,955 A * | 9/1998 | Hwang et al. ......... | 365/230.06 |
| 5,812,483 A | 9/1998 | Jeon et al. ............. | 365/230.06 |
| 6,166,957 A * | 12/2000 | Chung et al. .......... | 365/189.11 |
| 6,188,628 B1 * | 2/2001 | Tomotani ............... | 365/230.06 |
| 6,373,780 B1 * | 4/2002 | Micheloni et al. ...... | 365/230.06 |
| 6,385,091 B1 * | 5/2002 | Pekny ................... | 365/230.06 |

FOREIGN PATENT DOCUMENTS

| | | |
|---|---|---|
| JP | 04 112 217 A | 4/1992 |
| JP | 06 012 875 A | 1/1994 |

* cited by examiner

*Primary Examiner*—Tan T. Nguyen
(74) *Attorney, Agent, or Firm*—Laurence A. Greenberg; Werner H. Stemer; Ralph E. Locher

(57) ABSTRACT

An electronic driver circuit for word lines in a memory matrix is described. The driver circuit has coded outputs of a driver source, in particular of a current/voltage source, which are switched through to selected word lines. In this context, the word lines are selected in blocks by a control signal, and the outputs of the driver source are connected thereto. The coding of the driver source then selects the respective active word line.

19 Claims, 2 Drawing Sheets

ELECTRONIC DRIVER CIRCUIT FOR WORD LINES IN A MEMORY MATRIX, AND MEMORY APPARATUS

BACKGROUND OF THE INVENTION

FIELD OF THE INVENTION

The invention relates to an electronic driver circuit for word lines in a memory matrix and also to a memory apparatus, in particular a magneto-resistive random access memory (MRAM) apparatus.

Semiconductor memories normally contain a cell array having a matrix of column and row lines, otherwise known as word and bit lines, at whose points of intersection the respective memory cell is located. In this case, the word line in a memory component is used for addressing during read and write operations, and the bit line is used for reading or writing to the memory cell.

The memory elements used in an MRAM memory cell are typically magnetic tunnel elements (TMR elements; TMR: tunnelling magnetoresistance). Such a TMR element contains, in principle, two magnetic layers, a hard magnetic layer and a soft magnetic layer. The layers are isolated from one another by an insulating intermediate layer having a thickness of only a few atomic layers. The magnetizations in the two layers may have both the same direction and opposite directions. The insulating barrier between the magnetic layers is so thin that, after a voltage has been applied, a few electrons can pass; a "tunnel current" flows. In this context, the level of the tunnel current depends on the orientation of the magnetization directions with respect to one another.

Such a memory is written to by applying an electric current to a word line and a bit line in order to stipulate the magnetization direction of the "soft" magnetic layer. The direction of the currents determines the content of the memory element. The currents required are relatively high (approximately 2.5 mA), particularly for writing, since the magnetization is produced by overlaying the magnetic fields of the currents in the word line and bit line.

For a read operation, a defined voltage is applied to the word line of the selected memory cell, and the defined voltage should be different from the voltage of the selected bit lines. On the bit lines running perpendicular to the word lines, it is then possible—depending on the nature of the evaluation circuit on the bit lines—to evaluate a reading current or a reading voltage, which vary depending on the content of the addressed memory cell.

A requirement of the driving conditions is that each word line in a memory matrix in an MRAM component needs to be driven by in some cases very powerful transistors, which take up a relatively large area in integrated circuits. The transistors should be able to switch the high writing currents and to provide various voltage potentials for the un-activated and activated word lines. For the word lines in an MRAM cell array which are situated extremely close together, a special configuration is therefore required in order to minimize the area requirement and wiring complexity of the word line driver circuit.

SUMMARY OF THE INVENTION

It is accordingly an object of the invention to provide an electronic driver circuit for word lines in a memory matrix and a memory apparatus which overcomes the above-mentioned disadvantages of the prior art devices of this general type, which allows the wiring complexity and the area of the driver circuit to be reduced.

With the foregoing and other objects in view there is provided, in accordance with the invention, an electronic driver circuit for word lines in a memory matrix. The driver circuit contains a driver source having a plurality of outputs and the outputs include coded outputs, and a plurality of word line switches connected between the outputs of the driver source and the word lines such that the outputs of the driver source are switchably connected to the word lines. The word line switches receive and are driven by a control signal.

The invention provides that such a driver circuit for word lines in the memory matrix has the driver source, preferably the current/voltage source, having a plurality of outputs and a plurality of word line switches. The word line switches switchably connect the outputs of the driver source to the word lines. The outputs of the driver source have a plurality of coded outputs, which are connected to the word lines by the word line switches, the word line switches being selected by one or more control signals. The coded outputs supply the necessary signals for reading and writing to memory cells on a word line.

The inventive concept is that a number of word lines are first selected and the coded outputs of a driver source are applied thereto. In this context, the coded outputs of the driver source are isolated from the unselected word lines by the appropriate word line switches. The driver circuit makes it possible to avoid providing for each of the word lines a dedicated line driver or a complex word line switch which switches through the respectively provided signals to the word line in the manner of a multiplexer. This allows the word line switches to be configured using little circuit and wiring complexity.

In one preferred embodiment, each of the coded outputs of the driver source can assume various output values, which respectively correspond to a particular operating mode of the word lines. The outputs are coded such that they provide the various output values according to the desired operating mode of the respective word line. The respective output, which is in each case switched through to only one of the word lines, is coded on the basis of addressing provided for the respective word line and for the operating mode provided at that point. The fact that the word line signals are actually coded in the driver source results in that the circuit complexity for the word line switches can be significantly reduced. The various output values can be current values or voltage values.

Preferably, another provision is that the outputs of the driver source contain at least one further output, which is switched through to all the word lines, which are not selected by the control signal. This ensures that the inactive word lines are at a fixed potential and do not assume an undesirable voltage by floating.

Another provision in accordance with one preferred embodiment may be that the circuit receives a plurality of control signals, each of which controls a number of the plurality of word line switches, and that at most one of the control signals switches through the coded outputs of the driver source to the respective word lines via the word line switches. In this way, in each case only one of the coded outputs is connected to a respective one of the word lines. This advantageously allows the number of outputs provided for the driver source to be reduced. The word lines are thus subdivided into a plurality of blocks, each of the blocks having a number of word lines, which corresponds to the number of coded outputs of the driver source. In this context, it is expedient to weigh the respective circuit and wiring complexity arising when a driver source having a number of outputs is produced and the saving on circuit and wiring complexity for the word line switches against one another.

Preferably the word line switches are in the form of transistors. This has the advantage that the switches are easy to produce in integrated circuits. In integrated circuits, it is also expedient, for technological reasons, to provide metal oxide semiconductor (MOS) transistors as switching elements. These additionally have low losses, i.e. the control input has virtually no current, which results in that little driver power is required when driving a plurality of such control inputs, e.g. using the control signal.

Preferably, the coded outputs of the driver source are switchably connected to the word lines by first transistors, and the further outputs of the driver source are connected to the word lines using second transistors. In this context, the first transistors are preferably chosen so that they turn on when selected by the control signal, and the second transistors are chosen so that they turn off in the case of the same control signal. The coded outputs are then connected to the word lines as a result of being selected by the control signal. The further outputs are consequently applied to the word lines not selected by the control signal by the second transistors. This advantageously ensures that, according to selection, either the coded outputs or the further outputs are connected to the word lines, which defines the respective operating mode of a word line.

Preferably, provision may be made for the first transistors to be N-MOS transistors, and for the second transistors to be P-MOS transistors and to be connected to a respective word line, the first and second transistors being controlled by the control signal. This is advantageous because N-MOS transistors and P-MOS transistors can be operated in complementary fashion, so that they can be addressed using only one control signal.

In accordance with one preferred embodiment, provision is also made for the first and second transistors to be N-MOS transistors which are controlled by two control signals such that in each case only the first transistor or only the second transistor on each of the word lines is on, and the other one is off. This is advantageous because N-MOS transistors have a smaller area than P-MOS transistors for the same power and are able to switch voltage levels in other ranges.

Preferably, a first voltage potential is present at at least one of the coded outputs, and a second voltage potential is present at the further output of the driver source, the first and second voltage potentials being approximately the same. When changing between a write and a read operation, the voltage potential of all unselected word lines and all inactive word lines, i.e. word lines which are not in a read or write mode, should preferably remain unchanged, since a flow of current through the unaddressed memory elements also needs to be prevented as far as possible in this case.

In one preferred embodiment, four word lines activated by one control signal are provided, since this allows the area of the circuit complexity to be minimized for the word lines.

Generally, the number of word lines selected by a control signal can be assumed to be arbitrary, however.

Preferably, that output of the driver source, which is connected to an active word line by an appropriate word line switch outputs a current for the purpose of writing to the memory matrix. Such a writing current on the word line permits writing to, by way of example, TMR memory elements in MRAMs.

In one preferred embodiment, that output of the driver source, which is connected to an active word line by the appropriate word line switch, outputs a reading voltage for the purpose of reading from the memory matrix. The reading voltage should be different than the voltage on the unselected word lines. This is necessary to ensure that a current flows through the TMR memory cell only via the active word line. If the voltages were the same, this would possibly result in a flow of current through a plurality of TMR elements, which would mean that it would no longer be possible to establish that memory cell through which the current were flowing, and it would thus no longer be possible to read the content of the individual memory cell.

In addition, a memory apparatus having an inventive driver circuit is preferably provided. The circuit complexity for the word line drivers can be greatly reduced in this apparatus, which allows the word line spacing to be reduced.

In this regard, another provision is made in the memory apparatus in that the two ends of the word lines can be respectively provided with the inventive driver circuit. This allows parasitic flows of current to be reduced. In this context, however, it is necessary to ensure that, when impressing currents on to the respective active word line, the output currents of the coded driver source have the same magnitude, but different arithmetic signs at the two ends.

Other features which are considered as characteristic for the invention are set forth in the appended claims.

Although the invention is illustrated and described herein as embodied in an electronic driver circuit for word lines in a memory matrix and a memory apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
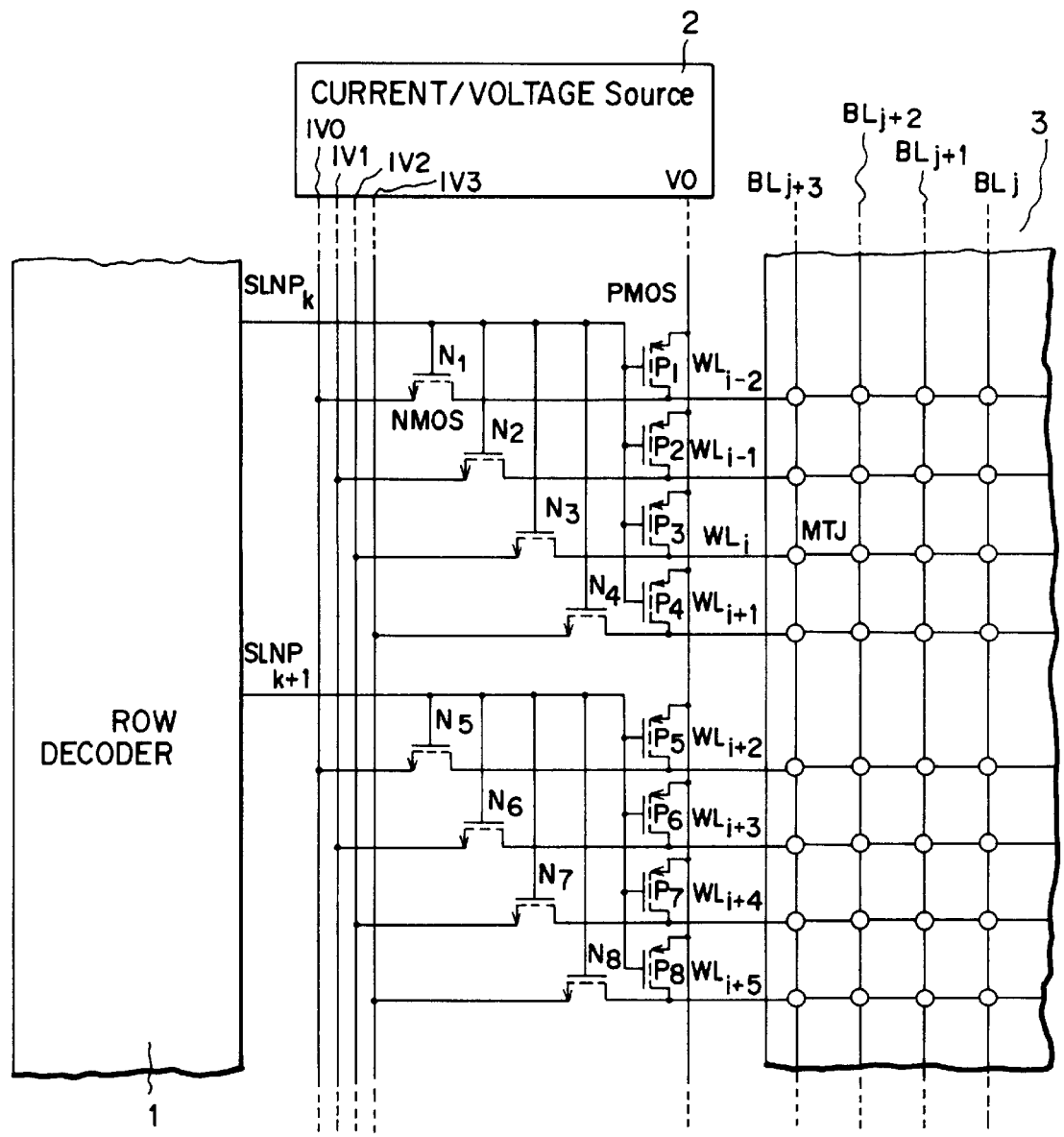
FIG. 1 is a block circuit diagram of a predecoded word line switch configuration having NMOS transistors and PMOS transistors according to the invention.

In all the figures of the drawing, sub-features and integral parts that correspond to one another bear the same reference symbol in each case. Referring now to the figures of the drawing in detail and first, particularly, to FIG. 1 thereof, there is shown a circuit configuration in which blocks of, in each case, four word lines $WL_{i-2}$–$WL_{i+1}$; $WL_{i+2}$–$WL_{i+5}$ are driven by a respective control signal SLNP from a row decoder 1. The circuit is based on the use of NMOS transistors and PMOS transistors $N_1$–$N_8$; $P_1$–$P_8$. The NMOS transistors $N_1$ to $N_4$ and $N_5$ to $N_8$ are connected such that the respective control signal $SLNP_k$ or $SLNP_{k+1}$ from the row decoder 1 is applied to the control inputs (gates) of the transistors $N_1$–$N_8$; $P_1$–$P_8$, which switches through four outputs IV0–IV3 of a current/voltage source 2 to four selected word lines WL in each case.

According to a coding of the outputs IV0–IV3, i.e. depending on whether a current value or a voltage value is present at the outputs IV0 to IV3, a current flows through the word line WL, or a voltage is present. The PMOS transistors $P_1$ to $P_8$ are connected such that, in the event of a non-selecting control signal $SLNP_{k+1}$ from the row decoder 1 being present, they switch through a voltage V from a further output V0 of the current/voltage source 2 to the word lines WL. The number of outputs IV0–IV3 is not limited to the number 4, but instead is chosen by the person skilled in the art on the basis of the instance of application.

To illustrate the circuit configuration, a write operation to the word line $WL_i$ of an MRAM memory matrix 3 is first considered. For this, a writing current is impressed into the word line $WL_i$ via the coded output IV2 and the turned-on transistor $N_3$, while all the other word lines $WL_{i-2}$, $WL_{i-1}$ and $WL_{i+1}$ essentially have the corresponding voltage from the outputs IV0, IV1, IV3 of the current/voltage source present on them, and the word lines $WL_{i+2}$ to $WL_{i+5}$ essentially have the voltage V present on them. Preferably, these voltages have the same potential, which is chosen such that a flow of current through the connected memory cells is prevented. The row decoder 1 outputs the control signal $SLNP_k$, the control signal $SLNP_{k+1}$ and possibly further control signals $SLNP_{k+n}$. The selecting control signal $SLNP_K$ has turned on the four NMOS transistors $N_1$ to $N_4$, and the control signal line $SLNP_{k+1}$ has turned off the four NMOS transistors $N_5$ to $N_8$ (and all other NMOS transistor by further control signals $SLNP_{k+n}$ for additional word lines not illustrated). The behavior in the case of the four PMOS transistors $P_1$ to $P_4$ and $P_5$ to $P_8$ respectively connected to the two control signal lines is exactly the opposite. The PMOS transistors $P_1$ to $P_4$ on the control line $SLNP_k$ are off, and the signal $SLNP_{k+1}$ turns on the transistors $P_5$ to $P_8$. The NMOS transistors $N_1$ to $N_4$ turned on by the control signal $SLNP_k$ let through the currents and essentially also the voltages of the current/voltage sources IV0 to IV3.

In the example shown, the output IV2 of the current/voltage source 2 impresses the writing current into the word line $WL_i$ via the turned-on NMOS transistor $N_3$. The outputs IV0, IV1 and IV3 of the current/voltage source 2 are used to apply the respective, preferably identical voltages to the unselected word lines $WL_{1-2}$, $WL_{i-1}$ and $WL_{i+1}$ via the NMOS transistors $N_1$, $N_2$ and $N_4$. In the case of the word line blocks $WL_{i+2}$–$WL_{i+5}$ that are not selected by the control signal $SLNP_{k+1}$ of the row decoder 1, the PMOS transistors $P_5$ to $P_8$ are on. The voltage V, for example, is then applied to the word lines $WL_{i+2}$ to $WL_{i+5}$. The voltage V is preferably selected such that it is the same as the voltages at the coded outputs IV0, IV1 and IV3.

Reading from the memory takes place in a similar manner. If a data word stored at the address of the word line $WL_i$ is to be read, then the coded output IV2 is used to apply not a current, but rather a voltage, which is different than the other voltages, which results in that the word line $WL_i$ is selected. Via the outputs IV0, IV1, IV3 and V0, all the unaddressed word lines $WL_{i-2}$, $WL_{i-1}$, $WL_{i+1}$–$WL_{i+5}$ of the memory matrix 3 are likewise at a fixed voltage. This is preferably the same voltage, which was also applied to the unaddressed word lines WL for writing.

The current/voltage source 2 having the coded outputs IV0 to IV3 thus undertake provision of the driver power and some of the addressing at the same time, which results in that the requirement for the control lines SLNP from the row decoder 1 to the switching transistors $N_1$–$N_8$; $P_1$–$P_8$ is only a quarter of that for the word lines WL in the memory matrix 3.

The current/voltage source 2 is configured such that for both the read and write operations the word lines WL of a four-element block are driven by the output signals provided by the outputs IV0 to IV3. The unaddressed word lines $WL_{i-2}$, $WL_{i-1}$, $WL_{i+1}$ have, accordingly, essentially (less a voltage drop across the respective switching transistor) the voltages present on them at the respective output IV0–IV3. The voltage V is present on all the word lines $WL_{i+2}$–$WL_{i+5}$ of the four-element blocks, which are not selected by the control signal $SLNP_k$.

In the case of the write operation to an MRAM memory cell, a particular word line WL is addressed by an appropriate current at the particular output IV0–IV3 of the current/voltage source 2. According to the memory content to be written, the current can have a positive or negative direction of flow. In the case of reading in the MRAM memory cell, the addressing output signal is a voltage, which is different than the voltage of the unselected word lines WL. This results in a flow of current through the memory cell on to the bit lines connected thereto, the level of the current representing the content of the memory cells.

Figure 2:
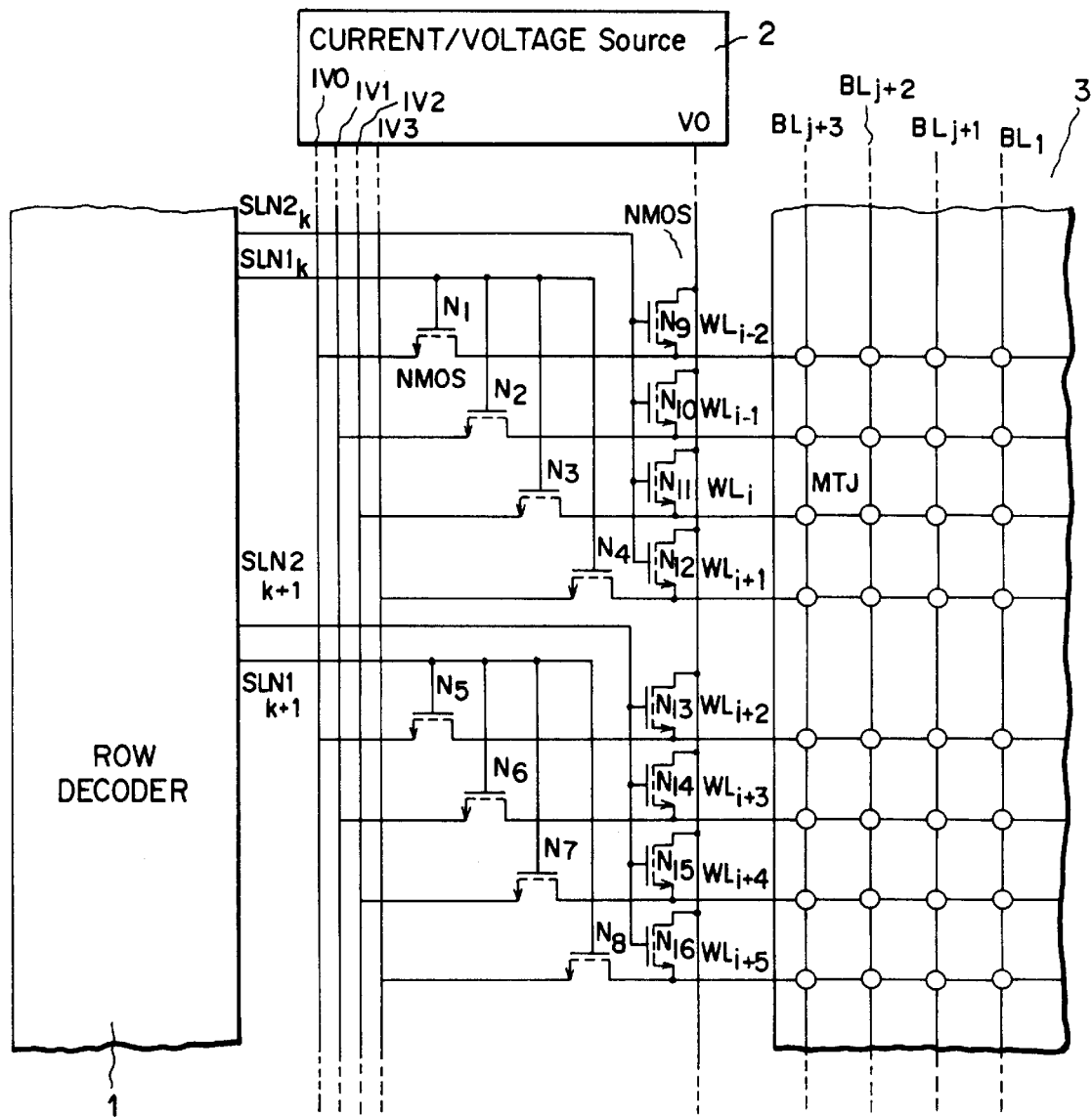
FIG. 2 is a block circuit diagram of the predecoded word line switch configuration having the NMOS transistors.

The choice from the possible voltages is restricted when using PMOS transistors in accordance with the exemplary embodiment shown in FIG. 1. Particularly the voltage potential of 0 V cannot be switched to the word lines WL using P-MOS transistors under the standard operating conditions of integrated circuits (e.g. $V_{DD}$=5V, 3.3V or 1.8V or $V_{GND}$=0V). For this reason, in a further embodiment, shown in FIG. 2, NMOS transistors are used instead of the PMOS transistors, since these are better suited to switching voltages close to the potential of 0 volts. Operation is similar to in the case of the circuit in FIG. 1. However, the PMOS switching transistors for switching the output V have now been replaced by NMOS transistors $N_9$ to $N_{12}$ and $N_{13}$ to $N_{16}$. On account of the necessary gate voltage, however, these can no longer be switched together by a line having the associated NMOS transistors $N_1$ to $N_4$ and $N_5$ to $N_8$. For each four-element block, separate control lines $SLN1_k$ and $SLN2_k$ are therefore required, which results in that the wiring complexity for the control lines SLNP can now be reduced only to half the number of word lines WL in the memory matrix 3. However, this drawback is offset because integrated NMOS transistors require a smaller area than PMOS transistors for the same driver power.

The logic levels $SLN1_k$ and $SLN2_k$ have an essentially inverted profile. Only the voltage levels of $SLN2_k$ are proportioned, as compared with the exemplary embodiment in FIG. 1, such that they allow the voltage V to be switched to the word lines WL using the NMOS transistors $N_9$ to $N_{12}$ and $N_{13}$ to $N_{16}$.

To be able to impress the current into the selected word line WL, it may be expedient to use circuitry in accordance with the invention at both ends of the word lines WL, but the current/voltage sources 2 should then supply currents having the same magnitude but different arithmetic signs. Such complementarily directed current sources reduce parasitic flows of current to a considerable extent. Similarly, applying a voltage to both ends of a word line WL can reduce the effects of voltage drops caused by parasitic currents. The features of the invention disclosed in the preceding description, in the claims and in the drawings may be fundamental to implementing the invention in its various embodiments both individually and in any desired combination.

We claim:
1. An electronic driver circuit for word lines in a memory matrix, comprising:

a driver source having a plurality of outputs and said outputs include coded outputs; and a plurality of word line switches connected between said outputs of said driver source and the word lines such that said outputs of said driver source are switchably connected to the word lines, said word line switches receiving and driven by a control signal.

2. The driver circuit according to claim 1, wherein each of said coded outputs of said driver source output various output values which respectively correspond to a particular operating mode of the word lines, the various output values are coded according to a desired operating mode of each of the word lines.

3. The driver circuit according to claim 2, wherein said outputs of said driver circuit include at least one further output connected to all of the word lines through said word line switches, said further output outputting a further value switched through to the word lines which are not selected by the control signal.

4. The driver circuit according to claim 3, wherein said word line switches include first transistors and second transistors.

5. The driver circuit according to claims 4, wherein said coded outputs of said driver source are connected to the word lines by said first transistors.

6. The driver circuit according to claim 4, wherein said further output of said driver source is connected to the word lines by said second transistors.

7. The driver circuit according to claim 4, wherein said first transistors are N-MOS transistors, said second transistors are P-MOS transistors each connected to a respective one of the word lines, said first transistors and said second transistors are controlled by the control signal.

8. The driver circuit according to claim 4, wherein the control signal is one of two control signals, said first transistors and said second transistors are N-MOS transistors which are controlled by the two control signals such that in each case only one of said first transistor and said second transistor connected to each of the word lines is on, and the other one is off.

9. The driver circuit according to claim 3, wherein a first voltage potential is present at at least one of said coded outputs, and a second voltage potential is present at said further output of said driver source, the first voltage potential being approximately equivalent to the second voltage potential.

10. The driver circuit according to claim 2, wherein the various output values are selected from the group consisting of current values and voltage values.

11. The driver circuit according to claim 1, wherein said control signal is one of a plurality of control signals received by said word line switches, each of the control signals controls a number of said word line switches, such that at most one of the control signals switches through said coded outputs of said driver source to respective word lines through said word line switches, so that in each case only one of said coded outputs is connected to a respective one of the word lines.

12. The driver circuit according to claim 11, wherein the number of word lines, which are activated by one of the control signals is 4.

13. The driver circuit according to claim 1, wherein said driver source is a current/voltage source.

14. The driver circuit according to claim 1, wherein a respective output of said outputs of said driver source, which is connected to an active word line by one of said word line switches, outputs a current for writing to the memory matrix.

15. The driver circuit according to claim 1, wherein a respective output of said outputs of said driver source, which is connected to an active word line by one of said word line switches, outputs a reading voltage for reading from the memory matrix.

16. A memory apparatus, comprising:

a memory matrix;

word lines connected to said memory matrix;

an electronic driver circuit, including:
    a driver source having a plurality of outputs and said outputs include coded outputs; and
    a plurality of word line switches connected between said outputs of said driver source and said word lines such that said outputs of said driver source are switchably connected to said word lines, said word line switches receiving and driven by a control signal.

17. The memory apparatus according to claim 16, wherein said electronic driver circuit is one of two electronic driver circuits each connected to one of two ends of said word lines.

18. The memory apparatus according to claim 17, wherein said driver sources have current sources disposed at both ends of said word lines, said driver sources configured such that currents impressed into a respective active word line have a same magnitude but a different arithmetic sign.

19. A nonvolatile magnetic semiconductor memory, comprising:

a memory apparatus, containing:
    a memory matrix;
    word lines connected to said memory matrix; and
    an electronic driver circuit, including:
        a driver source having a plurality of outputs and said outputs include coded outputs; and
        a plurality of word line switches connected between said outputs of said driver source and said word lines such that said outputs of said driver source are switchably connected to said word lines, said word line switches receiving and driven by a control signal.

* * * * *